(12) United States Patent
Tsujita et al.

(10) Patent No.: US 9,618,710 B2
(45) Date of Patent: Apr. 11, 2017

(54) OPTO-ELECTRIC HYBRID BOARD AND PRODUCTION METHOD THEREFOR

(71) Applicant: NITTO DENKO CORPORATION, Ibaraki-shi, Osaka (JP)

(72) Inventors: Yuichi Tsujita, Ibaraki (JP); Naoki Shibata, Ibaraki (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 15/031,943

(22) PCT Filed: Oct. 15, 2014

(86) PCT No.: PCT/JP2014/077373
§ 371 (c)(1),
(2) Date: Apr. 25, 2016

(87) PCT Pub. No.: WO2015/064355
PCT Pub. Date: Jul. 5, 2015

(65) Prior Publication Data
US 2016/0274317 A1    Sep. 22, 2016

(30) Foreign Application Priority Data

Oct. 29, 2013 (JP) ................................ 2013-224450

(51) Int. Cl.
*G02B 6/42* (2006.01)
*H05K 1/02* (2006.01)
*H05K 1/18* (2006.01)

(52) U.S. Cl.
CPC ............ *G02B 6/4224* (2013.01); *G02B 6/42* (2013.01); *G02B 6/428* (2013.01); *G02B 6/4214* (2013.01);
(Continued)

(58) Field of Classification Search
None
See application file for complete search history.

(56) References Cited

U.S. PATENT DOCUMENTS 6,438,281 B1    8/2002  Tsukamoto et al.
2009/0269704 A1  10/2009  Hodono
(Continued)

FOREIGN PATENT DOCUMENTS

JP    2000-347051 A    12/2000
JP    2001-196643 A     7/2001
(Continued)

OTHER PUBLICATIONS

Notification of Transmittal of Translation of the International Preliminary Report on Patentability (Form PCT/IB/338) issued in counterpart International Application No. PCT/JP2014/077373 mailed May 12, 2016 with Forms PCT/IB/373 and PCT/ISA/237. (9 pages).

(Continued)

*Primary Examiner* — Mike Stahl
(74) *Attorney, Agent, or Firm* — Westerman, Hattori, Daniels & Adrian, LLP

(57) ABSTRACT

An opto-electric hybrid board according to the present invention includes a substrate including an insulation layer and a metal reinforcement layer. An electric circuit part is provided on the front surface of the substrate, and an optical waveguide part is provided on the back surface thereof. The metal reinforcement layer includes an optical coupling through hole and an alignment through hole. The electric circuit part includes an electrical interconnect line, an optical element, a first alignment mark for positioning of a mirror part, and a second alignment mark for positioning of the optical element. The mirror part of the optical waveguide part is positioned with respect to the first alignment mark visually recognized through the alignment through hole, and (Continued)

the optical element of the electric circuit part is positioned with respect to the second alignment mark.

4 Claims, 6 Drawing Sheets

(52) U.S. Cl.
CPC ......... *G02B 6/4245* (2013.01); *H05K 1/0269* (2013.01); *H05K 1/0274* (2013.01); *G02B 6/4274* (2013.01); *H05K 1/181* (2013.01); *H05K 2201/10121* (2013.01)

(56) References Cited

U.S. PATENT DOCUMENTS

2010/0129026 A1   5/2010   Hodono
2010/0129036 A1   5/2010   Hodono
2014/0147076 A1*  5/2014   Tsujita ................ H05K 1/0274
                                                              385/14

FOREIGN PATENT DOCUMENTS

JP      2009-265342 A     11/2009
JP      2010-128098 A      6/2010
JP      2010-128200 A      6/2010

OTHER PUBLICATIONS

International Search Report dated Jan. 6, 2015, issued in counterpart International Application No. PCT/JP2014/077373 (in English) (2 pages).

\* cited by examiner

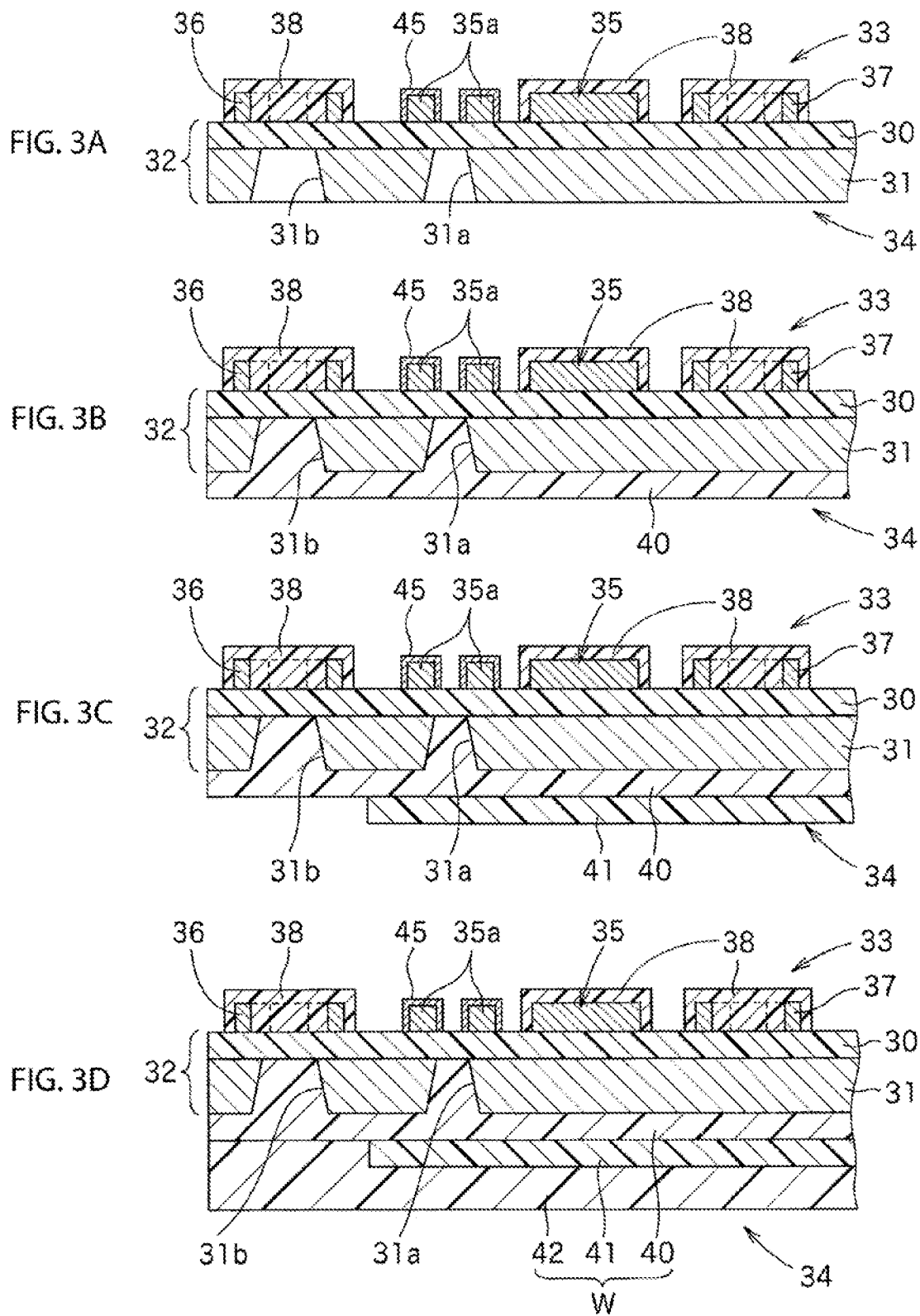

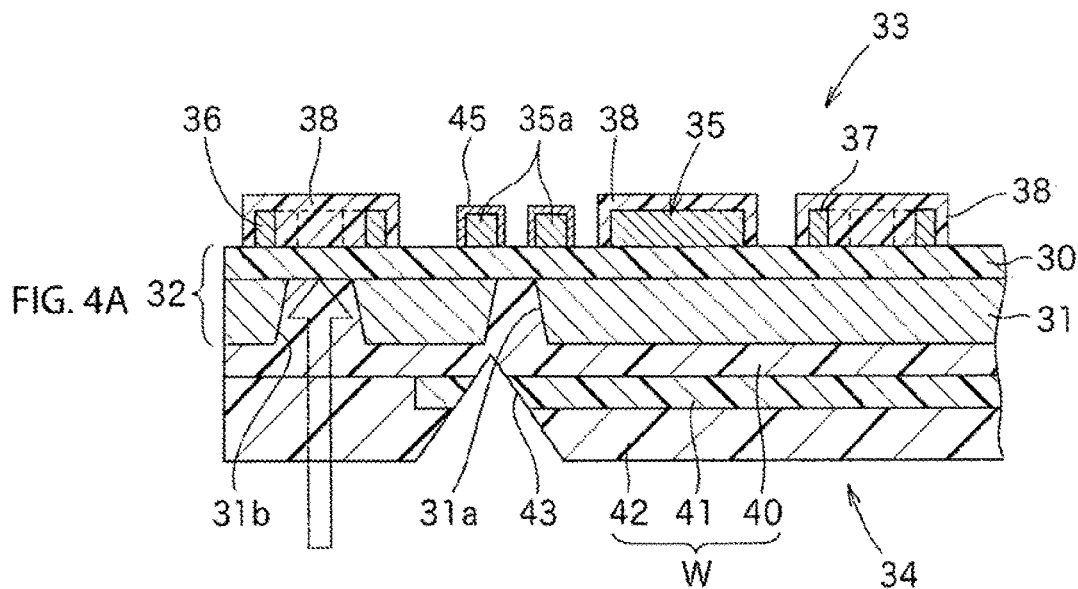
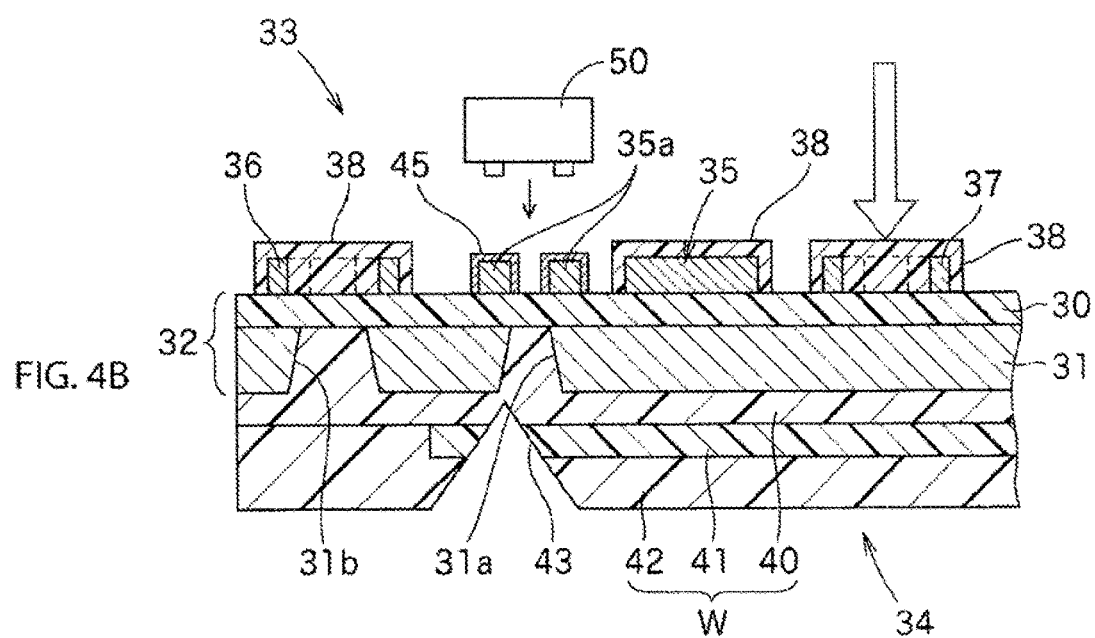

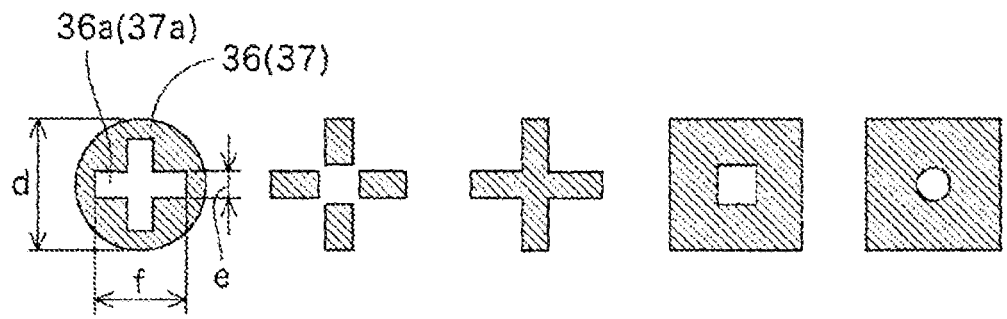
FIG. 5A  FIG. 5B  FIG. 5C  FIG. 5D  FIG. 5E
FIG. 6
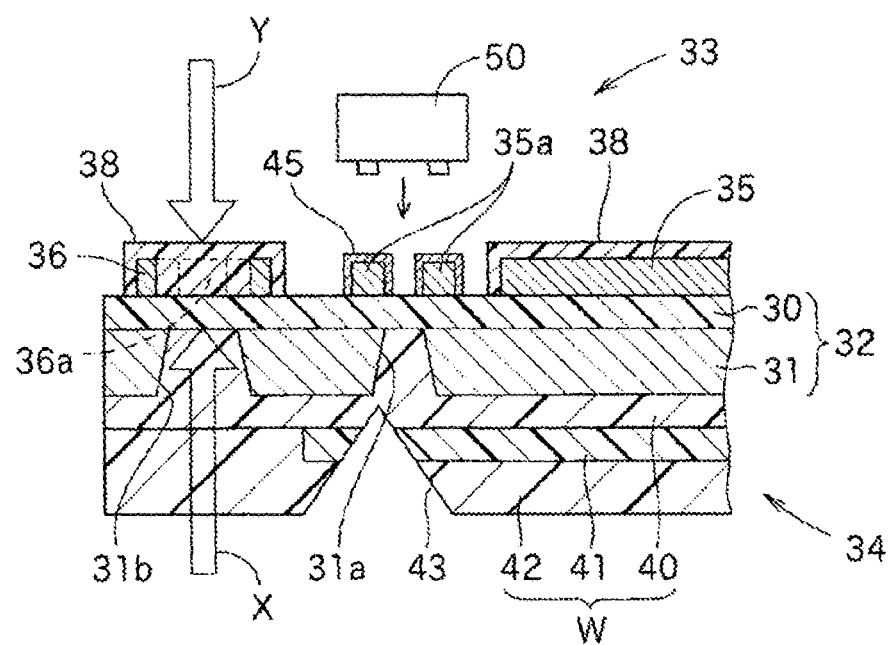

OPTO-ELECTRIC HYBRID BOARD AND PRODUCTION METHOD THEREFOR

TECHNICAL FIELD

The present invention relates to an opto-electric hybrid board including an electric circuit part with an optical element mounted therein and an optical waveguide part, and a method of manufacturing the same.

BACKGROUND ART

With the increase in the amount of transmission information, optical interconnect lines in addition to electrical interconnect lines have been used in recent electronic devices and the like. An opto-electric hybrid board in which an electric circuit part with an optical element mounted therein and an optical waveguide part are integrally provided has been used for various purposes.

The opto-electric hybrid board has a structure such that the optical waveguide part including an optical waveguide is provided along the back surface of a substrate and the electric circuit part having the electrical interconnect lines as a base is provided on the front surface thereof, and such that the optical element is mounted in a predetermined position in the electric circuit part. When the optical element is a light-receiving element, light transmitted in the optical waveguide is reflected from a mirror part provided at a downstream end of the optical waveguide to change its direction, and is then optically coupled to a light-receiving part of the optical element mounted on the front surface of the substrate. When the optical element is a light-emitting element, light emitted from the light-emitting element toward the back surface of the substrate is reflected from a mirror part provided at an upstream end of the optical waveguide to change its direction, and then enters the optical waveguide part.

To achieve high light propagation efficiency in the optical coupling between the optical element and the optical waveguide, it is important that the optical axis in the optical waveguide part and the optical axis of the light-receiving or light-emitting part of the optical element are precisely aligned with each other. To this end, it is necessary that the position of the mirror part that reflects light for the optical coupling and the position of the optical element mounted on an electric circuit are determined as precisely as possible in the production of the opto-electric hybrid board.

A variety of alignment methods have been proposed to determine the position of the mirror part and the position of the optical element with as high accuracy as possible. For example, the present assignee/applicant has proposed a structure of an opto-electric hybrid board and a method of manufacturing the same in which alignment marks are provided on both the front and back surfaces of a substrate in the opto-electric hybrid board so that the accuracy of the mounting position of the optical element is increased (see PTL 1, for example).

Specifically, as shown in FIG. 7, the aforementioned opto-electric hybrid board includes an electric circuit portion 1 and an optical waveguide portion 2. The electric circuit portion 1 includes a metal substrate 10, an insulation layer (not shown), an electric circuit 11, and a second alignment mark 15. The electric circuit 11 includes an optical element mounting pad 11a, and an optical element 3 is mounted on the optical element mounting pad 11a. The optical waveguide portion 2 is provided on the back surface of the substrate 10, with an adhesive layer 5 therebetween. The optical waveguide portion 2 includes a transparent under cladding layer 21, a core 22 for an optical path, a first alignment mark 24 positioned relative to an end portion 22a (serving as a mirror part for light reflection) of the core 22, and an over cladding layer 23 covering the core 22 and the first alignment mark 24. An identifying mark for the second alignment mark 15 is positioned with respect to the first alignment mark 24 on the back surface of the substrate. A through hole 12 for optical coupling is provided in the substrate 10. The optical path of light L is indicated by arrows in the figure. The reference numeral 14 designates a through hole for visual recognition of the first alignment mark 24 therethrough from the front surface side of the substrate.

According to this configuration, the first alignment mark 24 is positioned relative to the end portion 22a of the core 22, and the second alignment mark 15 is positioned with respect to the first alignment mark 24 relative to the end portion 22a of the core 22. Thus, the mounting position of the optical element 3 is practically positioned relative to the end portion 22a of the core 22. This provides increased positioning accuracy, as compared with the individual positioning of the first alignment mark 24 and the second alignment mark 15.

RELATED ART DOCUMENT

Patent Document

PTL 1: JP-A-2010-128200

SUMMARY OF INVENTION

In the aforementioned configuration, however, there is no guarantee that the end portion 22a of the core 22 and the position of the pad 11a in the electric circuit 11 are precisely positioned, even when the second alignment mark 15 is positioned relative to the end portion 22a of the core 22. If the position of the pad 11a is not in precise positional relationship with the end portion 22a of the core 22, there is a danger that the pad 11a and the optical element 3 are misaligned with each other, so that the optical element 3 cannot be mounted in a proper attitude on the pad 11a. Also, there is a danger that the adhesive layer 5 may become a factor in errors at the time of visual recognition, when the identifying mark for the second alignment mark 15 is positioned while the first alignment mark 24 on the back surface of the substrate is visually recognized from the front surface side of the substrate, because the electric circuit portion 1 and the optical waveguide portion 2 are bonded together with the adhesive layer 5.

In view of the foregoing, it is therefore an object of the present invention to provide an excellent opto-electric hybrid board including an optical element and an optical waveguide which are aligned with each other with very high accuracy, and a production method of manufacturing the same.

To accomplish the aforementioned object, a first aspect of the present invention is intended for an opto-electric hybrid board comprising: a substrate including an insulation layer having transparency and a metal reinforcement layer provided on the back surface of the insulation layer; an electric circuit part formed on the front surface of the substrate; and an optical waveguide part formed on the back surface of the substrate. The metal reinforcement layer includes an optical coupling through hole. The electric circuit part includes an electrical interconnect line including an optical element mounting pad and an optical element mounted on the pad. The optical waveguide part includes an optical waveguide and a mirror part for optical coupling: the optical waveguide including an under cladding layer having transparency, a core for an optical path, and an over cladding layer having transparency, the optical element on the front surface of the substrate and the optical waveguide on the back surface of the substrate being optically coupled to each other through the mirror part. A first alignment mark for positioning of the mirror part and a second alignment mark for positioning of the optical element are both on the front surface of the substrate. The first alignment mark and the second alignment mark are made of a same metal as the electrical interconnect line, and both marks are positioned based on the same reference as the electrical interconnect line. The metal reinforcement layer further includes an alignment through hole for allowing the first alignment mark on the front surface of the substrate to be visually recognized therethrough from the back surface side of the substrate. The mirror part of the optical waveguide part is positioned with respect to the first alignment mark visually recognized through the alignment through hole from the back surface side of the substrate, and the optical element of the electric circuit part is positioned with respect to the second alignment mark.

A second aspect of the present invention is intended for an opto-electric hybrid board comprising: a substrate including an insulation layer having transparency and a metal reinforcement layer provided on the back surface of the insulation layer; an electric circuit part formed on the front surface of the substrate; and an optical waveguide part formed on the back surface of the substrate. The metal reinforcement layer includes an optical coupling through hole. The electric circuit part includes an electrical interconnect line including an optical element mounting pad and an optical element mounted on the pad. The optical waveguide part includes an optical waveguide and a mirror part for optical coupling: the optical waveguide including an under cladding layer having transparency, a core for an optical path, and an over cladding layer having transparency, the optical element on the front surface of the substrate and the optical waveguide on the back surface of the substrate being optically coupled to each other through the mirror part. There is a first alignment mark for positioning both the mirror part and the optical element on the front surface of the substrate; the first alignment mark is made of a same metal as the electrical interconnect line, and is positioned based on the same reference as the electrical interconnect line. The metal reinforcement layer further includes an alignment through hole for allowing the first alignment mark on the front surface of the substrate to be visually recognized therethrough from the back surface side of the substrate. The mirror part of the optical waveguide part is positioned with respect to the first alignment mark visually recognized through the alignment through hole from the back surface side of the substrate, and the optical element of the electric circuit part is positioned with respect to the first alignment mark.

A third aspect of the present invention is intended for a method of manufacturing an opto-electric hybrid board as recited in the first aspect, the opto-electric hybrid board including a substrate including an insulation layer having transparency and a metal reinforcement layer provided on the back surface of the insulation layer, an electric circuit part formed on the front surface of the substrate, and an optical waveguide part formed on the back surface of the substrate, and wherein the metal reinforcement layer includes an optical coupling through hole, wherein the electric circuit part includes an electrical interconnect line including an optical element mounting pad and an optical element mounted on the pad, and wherein the optical waveguide part includes an optical waveguide and a mirror part for optical coupling; the optical waveguide includes an under cladding layer having transparency, a core for an optical path, and an over cladding layer having transparency; the optical element on the front surface of the substrate and the optical waveguide on the back surface of the substrate are optically coupled to each other through the mirror part. The production method comprises the steps of: forming a first alignment mark for positioning the mirror part and a second alignment mark for positioning the optical element through the use of a same metal as the electrical interconnect line, at the same time that the electrical interconnect line is formed; forming an alignment through hole for allowing the first alignment mark to be visually recognized therethrough at the same time that the optical coupling through hole is formed in the metal reinforcement layer; positioning a formation position of the mirror part with respect to the first alignment mark visually recognized through the alignment through hole from the back surface side of the substrate; and positioning a mounting position of the optical element with respect to the second alignment mark.

A fourth aspect of the present invention is intended for a method of manufacturing an opto-electric hybrid board as recited in the second aspect, the opto-electric hybrid board including a substrate including an insulation layer having transparency and a metal reinforcement layer provided on the back surface of the insulation layer, an electric circuit part formed on the front surface of the substrate, and an optical waveguide part formed on the back surface of the substrate, and wherein the metal reinforcement layer includes an optical coupling through hole, wherein the electric circuit part includes an electrical interconnect line including an optical element mounting pad and an optical element mounted on the pad, and wherein the optical waveguide part includes an optical waveguide and a mirror part for optical coupling; the optical waveguide includes an under cladding layer having transparency, a core for an optical path, and an over cladding layer having transparency; the optical element on the front surface of the substrate and the optical waveguide on the back surface of the substrate are optically coupled to each other through the mirror part. The production method comprises the steps of: forming a first alignment mark for positioning both the mirror part and the optical element through the use of a same metal as the electrical interconnect line, at the same time that the electrical interconnect line is formed; forming an alignment through hole for allowing the first alignment mark to be visually recognized therethrough at the same time that the optical coupling through hole is formed in the metal reinforcement layer; positioning a formation position of the mirror part with respect to the first alignment mark visually recognized through the alignment through hole from the back surface side of the substrate; and positioning a mounting position of the optical element with respect to the first alignment mark.

Thus, in addition to an electrical interconnect line including an optical element mounting pad in an electric circuit part on the front surface of the substrate, the opto-electric hybrid board according to the present invention has a structure such that the electric circuit part includes either two alignment marks, the first alignment mark positioning mirror part and the second alignment mark positioning the optical element, or a single first alignment mark for positioning both the mirror part and the optical element, and wherein an alignment mark is made of the same metal as the electrical interconnect line and positioned based on the same reference as the electrical interconnect line. On the back surface of the substrate, the mirror part of the optical waveguide part is formed while being positioned with respect to the first alignment mark for positioning the mirror part, which is visually recognized through the optical waveguide and the substrate. On the front surface of the substrate, the optical element of the electric circuit part is mounted on the pad while being positioned with respect to the second alignment mark for positioning the optical element or while being positioned with respect to the first alignment mark, which also positioning the optical element.

According to the aforementioned configuration, both the mounting position of the optical element in the electric circuit part and the mirror part in the optical waveguide part are positioned based on the same alignment reference as the arrangement of the electrical interconnect line including the optical element mounting pad. Thus, the mounting position and the mirror part are aligned with each other with high accuracy. In addition, there is no danger that the optical element is misaligned with the pad because the reference is in common with the arrangement of the electrical interconnect line including the pad. The optical element and the optical waveguide are optically coupled to each other with very high accuracy. Thus, the opto-electric hybrid board achieves low light propagation losses to provide high quality. When the core of the optical waveguide is formed while being positioned using first or second alignment mark made of the metal for the electrical interconnect line and positioned based on the same reference as the electrical interconnect line including the optical element mounting pad, the accuracy of the optical coupling is further increased. This achieves lower light propagation losses to provide higher quality.

According to the method of manufacturing an opto-electric hybrid board according to the present invention, either the first alignment mark for positioning the mirror part and the second alignment mark for positioning the optical element or a single first alignment mark for positioning both the mirror part and the optical element can be produced by using the same metal pattern as the electrical interconnect line in the same production step. This eliminates the need for another step for forming an alignment mark. Also, the alignment through hole for allowing the first alignment mark on the front surface of the substrate to be visually recognized therethrough from the back surface side of the substrate is formed in the same step as the conventional formation of the optical coupling through hole. This eliminates the need for another production step. Thus, the method has an advantage in that the opto-electric hybrid board of excellent quality is manufactured efficiently without incurring high costs.

The term "having transparency" as used in the present invention is intended to mean having a light permeability of not less than 40% at a wavelength of not less than 600 nm, and is to be interpreted as including not only being colorless and transparent but also being colored and transparent. The terms "visually recognize" and "visual recognition" are to be interpreted as including not only directly seeing with the naked eye but also seeing an image displayed by microscopes and various image display devices.

BRIEF DESCRIPTION OF DRAWINGS

FIGS. 3A to 3D are schematic illustrations showing the steps of producing the opto-electric hybrid board.

FIGS. 4A and 4B are schematic illustrations showing the steps of producing the opto-electric hybrid board.

FIGS. 5A to 5E are illustrations showing examples of an identifying mark for an alignment mark in the opto-electric hybrid board.

FIG. 6 is a schematic partial sectional view of the opto-electric hybrid board according to another embodiment of the present invention.

DESCRIPTION OF EMBODIMENTS

Next, embodiments according to the present invention will now be described in detail with reference to the drawings.

Figure 1:
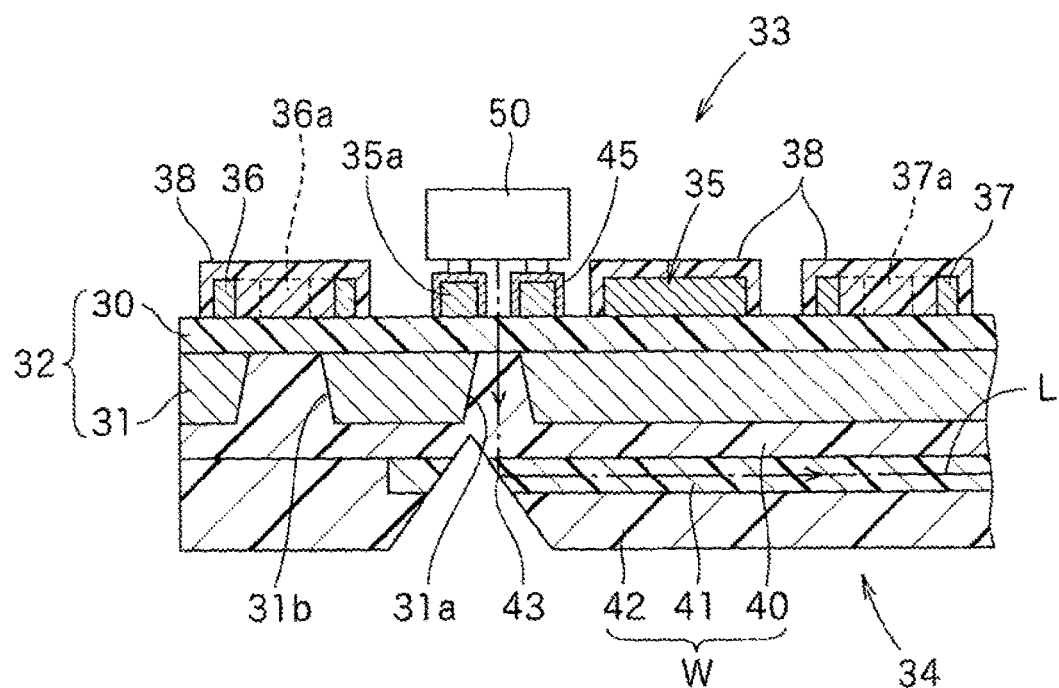
FIG. 1 is a schematic partial sectional view of an opto-electric hybrid board according to one embodiment of the present invention.

FIG. 1 shows an opto-electric hybrid board according to one embodiment of the present invention. This opto-electric hybrid board includes a substrate 32 including an insulation layer 30 having transparency and a metal reinforcement layer 31 provided on the back surface of the insulation layer 30. An electric circuit part 33 is formed on the front surface of the substrate 32, i.e. on the front surface of the insulation layer 30. An optical waveguide part 34 is formed on the back surface of the substrate 32, i.e. on the back surface of the metal reinforcement layer 31. Although not shown in the figure, the right half of the opto-electric hybrid board has a structure symmetrical to that of the left half thereof shown in the figure (which will not be described).

An electrical interconnect line 35 including an optical element mounting pad 35a is formed in the electric circuit part 33. An optical element 50 is mounted on a gold plating layer 45 formed on the pad 35a of the electrical interconnect line 35. In this example, this optical element 50 shown in the figure is a light-emitting element, and an optical element provided on the right-hand side (not shown) is a light-receiving element. Thus, light L has an optical path indicated by dash-and-dot lines in the figure in this opto-electric hybrid board. A first alignment mark 36 for positioning of a mirror part and a second alignment mark 37 for positioning of the optical element are provided in the vicinity of the pad 35a and are made of the same metal material as the electrical interconnect line 35. Each of the first and second alignment marks 36 and 37 is in the shape of a disk having the same thickness as the electrical interconnect line 35. As shown in top plan view of FIG. 5A, identifying marks 36a and 37a each including a cross-shaped through hole are formed centrally of the alignment marks 36 and 37, respectively. The electrical interconnect line 35, the first alignment mark 36, and the second alignment mark 37, except the pad 35a, are covered with a transparent coverlay 38, and are insulated and protected by the coverlay 38.

The metal reinforcement layer 31 on the back surface of the insulation layer 30 has an optical coupling through hole 31a formed therethrough, and an alignment through hole 31b formed therethrough for visual recognition of the first alignment mark 36 therethrough from the back surface side of the substrate 32.

An optical waveguide W including an under cladding layer 40 having transparency, a core 41 for an optical path, and an over cladding layer 42 having transparency is provided in the optical waveguide part 34 on the back surface of the metal reinforcement layer 31. A mirror part 43 that is a light reflecting surface inclined at an angle of 45 degrees is formed at an end of the optical waveguide W. The under cladding layer 40 or the over cladding layer 42 enters and fills the interior of the optical coupling through hole 31a and the alignment through hole 31b in the metal reinforcement layer 31.

According to the aforementioned configuration, the optical element 50 mounted on the front surface of the substrate and the mirror part 43 formed in the optical waveguide W provided on the back surface of the substrate are precisely aligned with each other and are optically coupled to each other with high accuracy through the optical coupling through hole 31a in the metal reinforcement layer 31. This achieves low light propagation losses in the optical coupling part of the optical element 50 and the optical waveguide W to provide high quality.

Figure 2A:
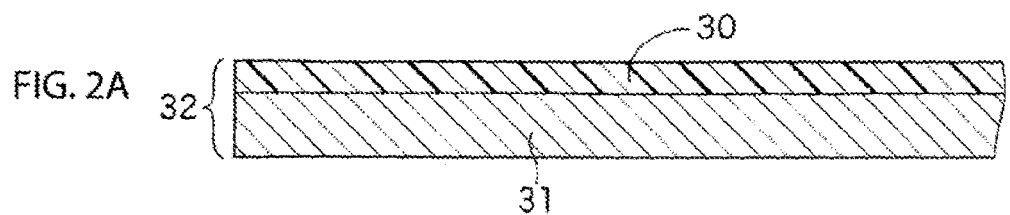
FIGS. 2A to 2D are schematic illustrations showing the steps of producing the opto-electric hybrid board.

The opto-electric hybrid board is manufactured, for example, in a manner to be described below. As shown in FIG. 2A, the flat metal reinforcement layer 31 is initially prepared. Examples of a material for the formation of the metal reinforcement layer 31 include stainless steel, copper, silver, aluminum, nickel, chromium, titanium, platinum and gold. Stainless steel is preferable from the viewpoints of strength, bending resistance and the like. It is preferable that the metal reinforcement layer 31 has a thickness generally in the range of 10 to 200 µm.

Then, the insulation layer 30 having a predetermined pattern is formed on the front surface of the metal reinforcement layer 31 by a photolithographic process. This provides the substrate 32 comprised of the insulation layer 30 and the metal reinforcement layer 31. The pattern of the insulation layer 30 is a pattern with a predetermined portion removed in consideration for the configuration of the electric circuit part 33 and the like such as the connection of the metal reinforcement layer 31 to a ground of an electric circuit. It is necessary that the insulation layer 30 has transparency so as to allow the first alignment mark 36 provided on the front surface of the substrate to be visually recognized therethrough from the back surface side. Polyimide resins and the like are preferably used for the insulation layer 30. In particular, fluorine-based polyimide resins having high transparency are preferably used. It is preferable that the insulation layer 30 has a thickness generally in the range of 3 to 50 µm.

Figure 2B:
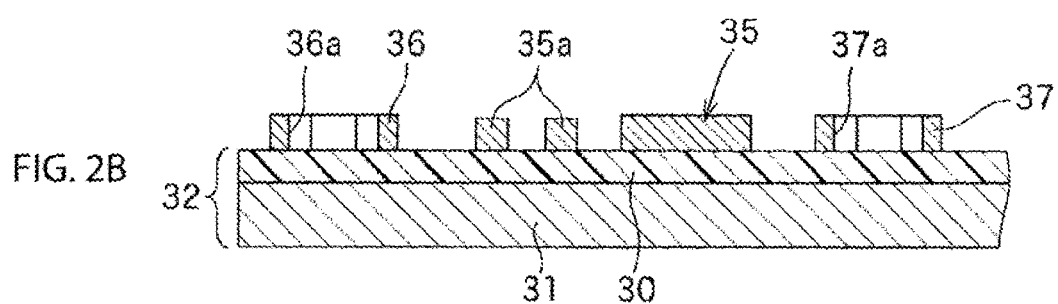

Next, as shown in FIG. 2B, the electrical interconnect line 35 including the optical element mounting pad 35a and the first and second alignment marks 36 and 37 are formed at the same time on the front surface of the insulation layer 30, for example, by a semi-additive process. Specifically, a metal film (not shown) made of copper and the like is formed on the front surface of the insulation layer 30 by sputtering, electroless plating or the like. This metal layer serves as a seed layer (a layer serving as a basis material for the formation of an electroplated layer) for a subsequent electroplating process. Then, a dry film resist is affixed to the opposite surfaces of a laminate comprised of the metal reinforcement layer 31, the insulation layer 30, and the seed layer. Thereafter, a photolithographic process is performed to form holes to make the pattern of the electrical interconnect line 35, the pattern of the first alignment marks 36 and the pattern of the second alignment marks 37 in the dry film resist on the side where the seed layer is formed, so that surface portions of the seed layer are uncovered at the bottoms of the holes.

Then, electroplating is performed to stack an electroplated layer made of copper and the like (having a thickness on the order of 3 to 30 µm) on the surface portions of the seed layer uncovered at the bottoms of the holes. Then, the remaining dry film resist is stripped away using a sodium hydroxide aqueous solution and the like. Thereafter, a portion of the seed layer, on which the electroplated layer is not formed, is removed by soft etching. Thus, stack portions comprised of the remaining electroplated layer and the underlying seed layer become the electrical interconnect line 35, the first alignment mark 36, and the second alignment mark 37. Examples of a material for the formation of the electrical interconnect line 35 and the first and second alignment marks 36 and 37 preferably used herein include metal materials excellent in electrical conductivity and in ductility such as chromium, aluminum, gold, and tantalum in addition to copper.

Figure 2C:
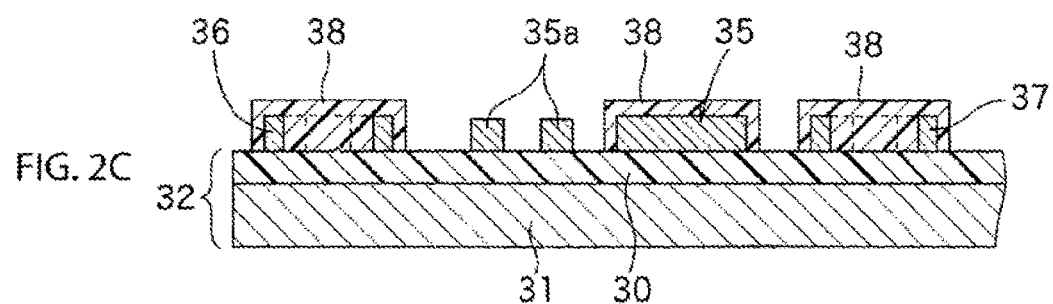

Next, an electroless plated layer made of nickel and the like (not shown) is formed on the front surfaces of the electrical interconnect line 35 and the first and second alignment marks 36 and 37. Thereafter, as shown in FIG. 2C, a photosensitive insulating resin including a polyimide resin and the like is applied to part of the electrical interconnect line 35 except the optical element mounting pad 35a and part of the first and second alignment marks 36 and 37 to form the coverlay 38 by a photolithographic process. It is preferable that the coverlay 38 has a thickness in the range of 1 to 20 µm. The coverlay 38 having a thickness in the aforementioned range produces an excellent function of protecting the electrical interconnect line 35 and the first and second alignment marks 36 and 37.

When the second alignment mark 37 is not covered with the coverlay 38 but is subjected to a plating process in a manner similar to that of the optical element mounting pad 35a, the mark is clearly seen during the visual recognition thereof at the time of optical element mounting, so that the visual recognizability thereof is improved. Thus, it is desirable in some cases that the second alignment mark 37 is not covered with the coverlay 38 but is subjected to a plating process, depending on the strength of the substrate 32 and the method of visual recognition. As occasion demands, an optimum processing method (covering with the coverlay 38, performing a plating process, or performing other processes) may be selected as appropriate.

Figure 2D:
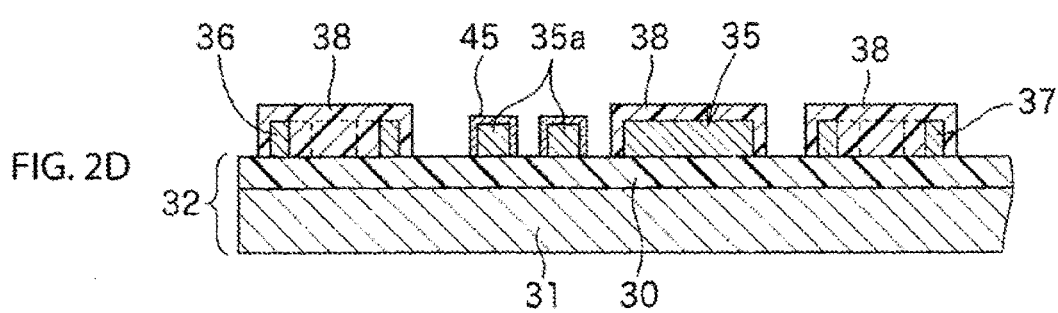

Next, the electroless plated layer (not shown) formed on the pad 35a included in the electrical interconnect line 35 is removed by etching. Thereafter, an electroplated layer 45 made of gold, nickel and the like (in this example, gold plated layer) is formed in sites where the electroless plated layer is removed, as shown in FIG. 2D.

Next, as shown in FIG. 3A, the optical coupling through hole 31a and the alignment through hole 31b (with reference to FIG. 1) are formed by etching and the like in predetermined positions of the metal reinforcement layer 31. These through holes 31a and 31b are formed in a manner to be described below. First, a dry film resist is affixed to the opposite surfaces of a stack comprised of the metal reinforcement layer 31, the insulation layer 30, the electrical interconnect line 35 and the like. Thereafter, a photolithographic process is performed to form holes having the pattern of the through holes 31a and 31b in the dry film resist on the side where the metal reinforcement layer 31 is formed, so that back surface portions of the metal reinforcement layer 31 are uncovered at the bottoms of the holes. Then, the portions of the metal reinforcement layer 31 uncovered in the holes are removed by etching using an aqueous etching solution depending on the material of the metal reinforcement layer 31 (for example, an aqueous ferric chloride solution for stainless steel), so that the optical coupling through hole 31a and the alignment through hole 31b are formed. In this manner, the electric circuit part 33 is provided.

The diameter of the optical coupling through hole 31a is set as appropriately depending on the specifications of the optical element 50. It is preferable that the diameter of the optical coupling through hole 31a is generally in the range of 0.05 to 0.2 mm. The diameter of the alignment through hole 31b depends on the size of the first alignment mark 36. It is, however, preferable that the diameter of the alignment through hole 31b is generally in the range of 0.1 to 3.0 mm.

Next, the optical waveguide part 34 having the optical waveguide W (with reference to FIG. 1) is formed on the back surface of the metal reinforcement layer 31. Specifically, a photosensitive resin which is a material for the formation of the under cladding layer 40 is applied to the back surface (the lower surface as seen in the figure) of the metal reinforcement layer 31. Thereafter, the applied layer is exposed to irradiation light. This exposure cures the applied layer to form the under cladding layer 40, as shown in FIG. 3B. It is necessary that the material for the formation of the under cladding layer 40 has transparency so as to allow the first alignment mark 36 provided on the front surface of the substrate to be visually recognized therethrough from the back side of the substrate. The under cladding layer 40 enters and fills the interior of the two through holes 31a and 31b in the metal reinforcement layer 31. It is preferable that the under cladding layer 40 has a thickness (thickness as measured from the back surface of the metal reinforcement layer 31) in the range of 1 to 50 μm. The under cladding layer 40 may be formed by patterning into a predetermined pattern by a photolithographic process.

Next, as shown in FIG. 3C, the core 41 having a predetermined pattern is formed on the front surface (the lower surface as seen in the figure) of the under cladding layer 40 by a photolithographic process. It is preferable that the core 41 has a thickness in the range of 5 to 100 μm. It is preferable that the core 41 has a width in the range of 5 to 100 μm. An example of a material for the formation of the core 41 includes a photosensitive resin similar to that for the under cladding layer 40, and the material used herein has a refractive index higher than that of the materials for the formation of the aforementioned under cladding layer 40 and the over cladding layer 42 to be described below (with reference to FIG. 3D). The adjustment of the refractive index may be made, for example, by considering the selection of the types of the materials for the formation of the under cladding layer 40, the core 41 and the over cladding layer 42, and the composition ratio thereof.

Next, as shown in FIG. 3D, the over cladding layer 42 is formed on the front surface (the lower surface as seen in the figure) of the under cladding layer 40 by a photolithographic process so as to cover the core 41. The over cladding layer 42 has a thickness (as measured from the front surface of the under cladding layer 40) not less than that of the core 41 and preferably in the range of 10 to 2000 μm. It is necessary that the material for the formation of the over cladding layer 42 has transparency like the material for the formation of the under cladding layer 40. An example of the material for the formation of the over cladding layer 42 includes a photosensitive resin similar to that for the under cladding layer 40. For the formation of the over cladding layer 42, patterning may be performed to form a predetermined pattern by a photolithographic process.

Then, as shown in FIG. 4A, a portion of the optical waveguide W corresponding to the pad 35a provided on the front surface of the insulation layer 30 (an end portion of the optical waveguide W with reference to FIG. 1) is formed into an inclined surface inclined at 45 degrees with respect to the longitudinal direction of the core 41 by laser beam machining, cutting and the like to provide the mirror part 43. At this time, the position in which the mirror part 43 is formed is determined at a position spaced a predetermined distance (specifically, a distance between the center of the first alignment mark 36 and the center of the pad 35a) apart from the first alignment mark 36 on the front side of the substrate. Thus, the position of the mirror part 43 is precisely determined relative to the position of the pad 35a on the front side of the substrate, i.e. relative to the position of optical coupling with the optical element 50.

Next, the optical element 50 is mounted on the pad 35a on the front side of the substrate. At this time, the mounting position of the optical element 50 is determined at a position spaced a predetermined distance (specifically, a distance between the center of the second alignment mark 37 and the center of the pad 35a) apart from the second alignment mark 37 on the front side of the substrate. Thus, the mounting position of the optical element 50 is precisely determined at the position of the pad 35a, and is accordingly precisely aligned with the position of the mirror part 43.

Examples of a method of mounting the optical element 50 include flip-chip mounting methods such as a solder reflow method and a C4 bonding method using screen printing of solder bumps and solder paste. Of these methods, flip-chip mounting methods using ultrasonic waves and heating are preferable from the viewpoint of reducing misregistration during the mounting. In particular, a mounting method using ultrasonic waves is optimum from the viewpoint of preventing heat damage to the metal reinforcement layer 31 of the substrate 32. In this manner, the intended opto-electric hybrid board is provided.

In the opto-electric hybrid board, the mounting position of the optical element 50 in the electric circuit part 33 and the position of formation of the mirror part 43 in the optical waveguide part 34 are determined based on the same alignment reference as the arrangement of the electrical interconnect line 35 including the optical element mounting pad 35a. Thus, both of the positions are aligned with each other with high accuracy. In addition, there is no danger that the optical element 50 is misaligned with the pad 35a because the reference is in common with the arrangement of the electrical interconnect line 35 including the pad 35a. Thus, the opto-electric hybrid board achieves low light propagation losses to provide high quality.

In the aforementioned example, the first and second alignment marks 36 and 37 are circular in shape as seen in plan view, and have the respective identifying marks 36a and 37a each including a cross-shaped through hole in the center thereof, as shown in FIG. 5A. The alignment marks 36 and 37 have a diameter d generally in the range of 100 to 1000 μm. The cross shape of the through holes of the identifying marks 36a and 37a is composed of vertical and horizontal rectangles each having a width e generally in the range of 10 to 300 μm and a length f generally in the range of 10 to 900 μm.

The shape of the identifying marks 36a and 37a as seen in plan view is not limited to the aforementioned example but may be any shape which allows the identifying marks to perform the function of positioning. Examples of the shape of the identifying marks 36a and 37a include a shape such that four rectangles are arranged in a cross shape as shown in FIG. 5B, a cross shape continuous in the center as shown in FIG. 5C, and whole square shapes with a square through hole and a circular through hole provided therein as shown in FIGS. 5D and 5E. FIGS. 5D and 5E may be modified such that whole square shape is replaced with a whole circle shape.

In the aforementioned example, the pad 35a in the electrical interconnect line 35, which is provided for the mounting of the optical element 50, is covered with the gold plating layer 45. However, such a cover using a plating layer is not necessary, depending on the material of the electrical interconnect line 35 and required characteristics.

In the aforementioned example, the first alignment mark 36 and the second alignment mark 37 are provided on the front surface of the insulation layer 30. Alternatively, as shown in FIG. 6, the second alignment mark 37 is not provided but only the first alignment mark 36 may be provided and used both for positioning for the formation of the mirror part 43 and for positioning for the mounting of the optical element 50. Specifically, in the configuration shown in FIG. 6, while the first alignment mark 36 on the front side of the substrate is viewed from the back surface side of the substrate through the substrate as indicated by a thick arrow X, the mirror part 43 is formed in the optical waveguide W in a predetermined location with respect to the central position of the identifying mark 36a. Also, while the identifying mark 36a of the first alignment mark 36 is directly seen from the front side of the substrate as indicated by a thick arrow Y, the optical element 50 is mounted in a predetermined location with respect to the central position of the identifying mark 36a.

With this configuration, the single first alignment mark 36 serves as a common positioning reference, when forming the mirror part 43 and mounting the optical element 50. This enables alignment of the position of formation of the mirror part 43 and the mounting position of the optical element 50 with each other with higher accuracy. This provides an excellent opto-electric hybrid board with lower light propagation losses. As in the case of the second alignment mark 37 in the aforementioned example, the single first alignment mark 36 may be subjected to the plating process without being covered with the coverlay 38 for the purpose of improving the visual recognizability thereof. Thus, as occasion demands, an optimum processing method (covering with the coverlay 38, performing a plating process, or performing other processes) may be selected as appropriate, depending on the strength of the substrate and the method of visual recognition.

Next, inventive examples of the present invention will be described in conjunction with a comparative example. It should be noted that the present invention is not limited to the inventive examples.

EXAMPLES

Inventive Example 1

The opto-electric hybrid board shown in FIG. 1 and having the first and second alignment marks 36 and 37 was produced in accordance with the aforementioned manufacturing method.

Inventive Example 2

The opto-electric hybrid board shown in FIG. 6 and having only the first alignment mark 36 was produced in accordance with the aforementioned manufacturing method.

Comparative Example 1

Figure 7:
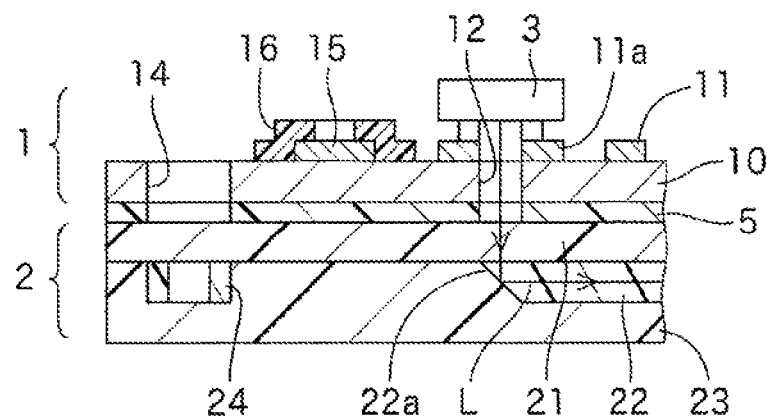
FIG. 7 is a schematic partial sectional view of an exemplary conventional opto-electric hybrid board.

The conventional opto-electric hybrid board shown in FIG. 7 was produced in accordance with the aforementioned manufacturing method. The materials, thicknesses and the like of the respective members were pursuant to the configurations of Inventive Examples 1 and 2.

[Measurement of Optical Insertion Loss]

A light-emitting element and a light-receiving element similar to those used in Inventive Examples 1 and 2 and Comparative Example 1 were prepared. Specifically, the light-emitting element is ULM850-10-TT-C0104U available from ULM Photonics GmbH. The light-receiving element is PDCA04-70-GS available from Albis Optoelectronics AG. Then, the amount of light $I_0$ was measured when light emitted from the light-emitting element was directly received by the light-receiving element. Next, in each of the article produced in Inventive Example 1 and the article produced in Comparative Example 1, light emitted from the light-emitting element mounted on one side of the substrate was received by the light-receiving element mounted on the opposite side of the substrate via the core (having a length of 20 cm) of the optical waveguide W, and the amount of received light I was measured. Based on these values, $[-10 \times \log(I/I_0)]$ was calculated. The calculated values were determined as light insertion losses.

TABLE 1

| | Inventive Example 1 | Inventive Example 2 | Comparative Example 1 |
|---|---|---|---|
| Light insertion loss (dB) | 7.0 | 6.8 | 8.4 |

The aforementioned results show that the articles produced in Inventive Examples 1 and 2 are significantly reduced in light insertion loss as compared with the article produced in Comparative Example 1 to achieve alignment for optical coupling with high accuracy.

Although specific forms in the present invention have been described in the aforementioned examples, the aforementioned examples should be considered as merely illustrative and not restrictive. It is contemplated that various modifications evident to those skilled in the art could be made without departing from the scope of the present invention.

The present invention is widely applicable to an excellent opto-electric hybrid board including an optical element and an optical waveguide which are aligned with each other with very high accuracy, and a method of manufacturing the same.

REFERENCE SIGNS LIST

30 Insulation layer
31 Metal reinforcement layer
31a Optical coupling through hole
31b Alignment through hole
32 Substrate
33 Electric circuit part
34 Optical waveguide part
35 Electrical interconnect line
35a Pad
36 First alignment mark
37 Second alignment mark
43 Mirror part
50 Optical element
W Optical waveguide

The invention claimed is:

1. An opto-electric hybrid board comprising:
a substrate including an insulation layer having transparency and a metal reinforcement layer provided on the back surface of the insulation layer;
an electric circuit part formed on the front surface of the substrate; and
an optical waveguide part formed on the back surface of the substrate,
wherein the metal reinforcement layer includes an optical coupling through hole,
wherein the electric circuit part includes an electrical interconnect line including an optical element mounting pad and an optical element mounted on the pad,
wherein the optical waveguide part includes an optical waveguide and a mirror part for optical coupling, the optical waveguide including an under cladding layer having transparency, a core for an optical path, and an over cladding layer having transparency,
wherein the optical element on the front surface of the substrate and the optical waveguide on the back surface of the substrate are optically coupled to each other through the mirror part,
wherein a first alignment mark for positioning of the mirror part and a second alignment mark for positioning of the optical element are both provided on the front surface of the substrate, the first alignment mark and the second alignment mark being made of a same metal as the electrical interconnect line and being positioned based on the same reference as the electrical interconnect line,
wherein the metal reinforcement layer further includes an alignment through hole for allowing the first alignment mark on the front surface of the substrate to be visually recognized therethrough from the back surface side of the substrate,
wherein the mirror part of the optical waveguide part is positioned with respect to the first alignment mark visually recognized through the alignment through hole from the back surface side of the substrate, and
wherein the optical element of the electric circuit part is positioned with respect to the second alignment mark.

2. An opto-electric hybrid board comprising:
a substrate including an insulation layer having transparency and a metal reinforcement layer provided on the back surface of the insulation layer;
an electric circuit part formed on the front surface of the substrate; and
an optical waveguide part formed on the back surface of the substrate,
wherein the metal reinforcement layer includes an optical coupling through hole,
wherein the electric circuit part includes an electrical interconnect line including an optical element mounting pad and an optical element mounted on the pad,
wherein the optical waveguide part includes an optical waveguide and a mirror part for optical coupling, the optical waveguide including an under cladding layer having transparency, a core for an optical path, and an over cladding layer having transparency,
wherein the optical element on the front surface of the substrate and the optical waveguide on the back surface of the substrate are optically coupled to each other through the mirror part,
wherein a first alignment mark for positioning both the mirror part and the optical element is provided on the front surface of the substrate, the first alignment mark being made of a same metal as the electrical interconnect line and being positioned based on the same reference as the electrical interconnect line,
wherein the metal reinforcement layer further includes an alignment through hole for allowing the first alignment mark on the front surface of the substrate to be visually recognized therethrough from the back surface side of the substrate,
wherein the mirror part of the optical waveguide part is positioned with respect to the first alignment mark visually recognized through the alignment through hole from the back surface side of the substrate, and
wherein the optical element of the electric circuit part is positioned with respect to the first alignment mark.

3. A method of manufacturing an opto-electric hybrid board according to claim 1, the opto-electric hybrid board including a substrate including an insulation layer having transparency and a metal reinforcement layer provided on the back surface of the insulation layer, an electric circuit part formed on the front surface of the substrate, and an optical waveguide part formed on the back surface of the substrate, the metal reinforcement layer including an optical coupling through hole, the electric circuit part including an electrical interconnect line including an optical element mounting pad, and an optical element mounted on the pad, the optical waveguide part including an optical waveguide and a mirror part for optical coupling, the optical waveguide including an under cladding layer having transparency, a core for an optical path, and an over cladding layer having transparency, the optical element on the front surface of the substrate and the optical waveguide on the back surface of the substrate being optically coupled to each other through the mirror part, the production method comprising the steps of:
forming a first alignment mark for positioning the mirror part and a second alignment mark for positioning the optical element through the use of a same metal as the electrical interconnect line, at the same time that the electrical interconnect line is formed;
forming an alignment through hole for allowing the first alignment mark to be visually recognized therethrough at the same time that the optical coupling through hole is formed in the metal reinforcement layer;
positioning a formation position of the mirror part with respect to the first alignment mark visually recognized through the alignment through hole from the back surface side of the substrate; and
positioning a mounting position of the optical element with respect to the second alignment mark.

4. A method of manufacturing an opto-electric hybrid board according to claim 2, the opto-electric hybrid board including a substrate including an insulation layer having transparency and a metal reinforcement layer provided on the back surface of the insulation layer, an electric circuit part formed on the front surface of the substrate, and an optical waveguide part formed on the back surface of the substrate, the metal reinforcement layer including an optical coupling through hole, the electric circuit part including an electrical interconnect line including an optical element mounting pad, and an optical element mounted on the pad, the optical waveguide part including an optical waveguide and a mirror part for optical coupling, the optical waveguide including an under cladding layer having transparency, a core for an optical path, and an over cladding layer having transparency, the optical element on the front surface of the substrate and the optical waveguide on the back surface of the substrate being optically coupled to each other through the mirror part, the production method comprising the steps of:
   forming a first alignment mark for positioning both the mirror part and the optical element through the use of a same metal as the electrical interconnect line, at the same time that the electrical interconnect line is formed;
   forming an alignment through hole for allowing the first alignment mark to be visually recognized therethrough at the same time that the optical coupling through hole is formed in the metal reinforcement layer;
   positioning a formation position of the mirror part with respect to the first alignment mark visually recognized through the alignment through hole from the back surface side of the substrate; and
   positioning a mounting position of the optical element with respect to the first alignment mark.

* * * * *